United States Patent [19]

Morelli et al.

[11] Patent Number: 4,905,067
[45] Date of Patent: Feb. 27, 1990

[54] INTEGRATED CIRCUIT FOR DRIVING INDUCTIVE LOADS

[75] Inventors: Marco Morelli, Livorno; Fabio Marchiò, Gallarate; Francesco Tricoli, Milan; Giampietro Maggioni, Cornaredo, all of Italy

[73] Assignee: SGS-Thomson Microelectronics S.p.A., Cantania, Italy

[21] Appl. No.: 173,213

[22] Filed: Mar. 25, 1988

[30] Foreign Application Priority Data

Mar. 31, 1987 [IT] Italy .................................. 19921 A/87

[51] Int. Cl.$^4$ ...................... H01L 27/04; H03K 3/01; H03K 3/26; H03K 3/335
[52] U.S. Cl. ................................ 357/48; 307/296.2; 307/303.1
[58] Field of Search ............... 357/48; 307/296, 296.2, 307/303.1

[56] References Cited

U.S. PATENT DOCUMENTS 3,649,887  3/1972  Keller et al. ........................... 357/48
3,940,785  2/1976  Genesi ................................... 357/48

Primary Examiner—Eugene R. LaRoche
Assistant Examiner—Michael Shingleton
Attorney, Agent, or Firm—Guido Modiano; Albert Josif

[57] ABSTRACT

An integrated circuit for driving inductive loads comprises at least one substrate and a plurality of separate epitaxial wells, and has at least one output terminal for connection to an inductive load and a reference terminal for connection to a reference voltage. To reliably isolate the different epitaxial wells in each operating state, the circuit comprises diodes interposed between the substrate on one side and the output and reference terminals on the other to set the substrate to the reference potential when the potential on the output terminal is greater than the reference potential and to set the substrate to the output potential when the latter becomes smaller than the reference potential.

5 Claims, 1 Drawing Sheet

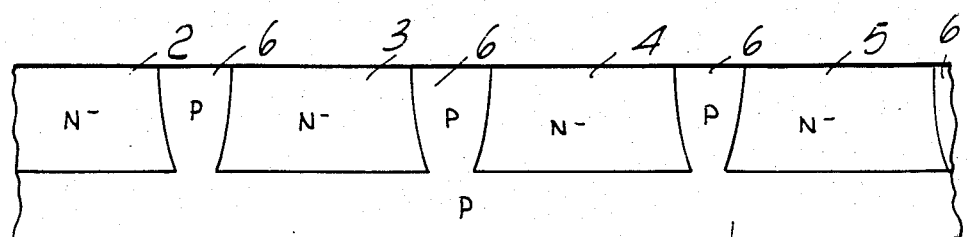
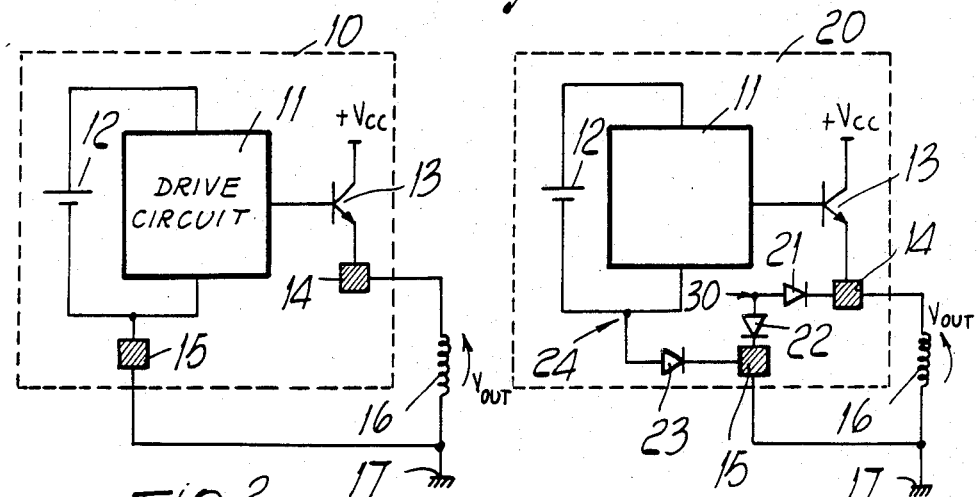
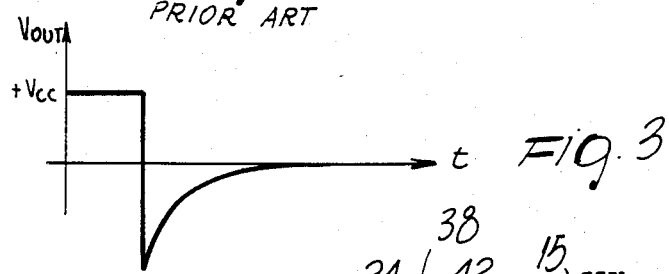
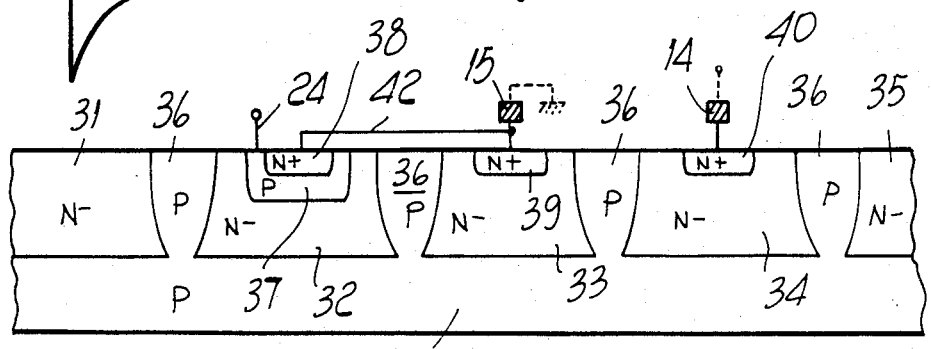

INTEGRATED CIRCUIT FOR DRIVING INDUCTIVE LOADS

BACKGROUND OF THE INVENTION

The present invention relates to an integrated circuit for driving inductive loads.

As is known, integrated circuits which use a P-type substrate require that said substrate be biased at the lowest voltage of the circuit so that the different epitaxial wells or regions which contain the active and passive components of the circuit are isolated from one another. In fact, the P-N junctions which form between the substrate and the different epitaxial wells are inversely biased and ensure an effective electrical isolation of said various wells.

It is furthermore known that in integrated circuits for driving inductive loads having a terminal connected to the earth (and thus hereinafter also defined as "loads" referred to earth), when the current supplied to the load is suddenly interrupted, a negative overvoltage is created across the latter. Accordingly, if the substrate, as occurs presently, is clamped to the ground, the epitaxial well or tubs connected to the load reaches a voltage lower than that of the substrate. In this condition said substrate injects current in the epitaxial well entailing a whole series of problems, such as for example the undesired activation of other components of the circuit.

To solve this problem, different solutions have already been studied, in particular to create preferential current paths to collect the current injected by the epitaxial well at negative voltage. However such solutions are not free from disadvantages, for example they are not applicable in all the required cases.

SUMMARY OF THE INVENTION

Given this situation, the aim of the present invention is to provide an integrated circuit for driving inductive loads referred to earth, capable of eliminating the disadvantages of the prior art, and in particular of keeping the substrate at an appropriate voltage for an effective isolation of the different epitaxial wells.

Within this aim, a particular object of the present invention is to provide an integrated circuit which has a simple structure, can be manufactured with the methods currently used in the integrated electronics industry and therefore has modest manufacturing costs.

Not least object of the present invention is to provide an integrated circuit which has a reduced bulk, and thus does not entail a high waste of area and operates reliably in all operating conditions.

This aim, as well as the objects mentioned and others which will become apparent hereinafter, are achieved by an integrated circuit for driving inductive loads according to the invention, as defined in the accompanying claims.

In practice, according to the invention, the substrate of the circuit is no longer rigidly clamped to the external reference voltage (earth) of the circuit, but is set at a voltage varying according to the operating state of said circuit: in particular when the voltage on the load (output voltage of the circuit) is positive with respect to the earth, the substrate is substantially at ground voltage, closely linked to the earth voltage, while when the output voltage drops below the external earth the substrate is biased at said output.

BRIEF DESCRIPTION OF THE DRAWINGS

Further characteristics and advantages of the invention will become apparent from the description of a preferred but not exclusive embodiment, illustrated only by way of nonlimitative example in the accompanying drawings, wherein:

FIG. 1 is a cross sectional view taken through a silicon wafer, in which a known integrated circuit is provided;

FIG. 2 is an equivalent electric diagram of a known integrated circuit;

FIG. 3 illustrates the plot of the output voltage on the load;

FIG. 4 is an equivalent electric diagram of the integrated circuit according to the invention; and FIG. 5 is a cross sectional view taken through a semiconductor wafer in which the circuit according to the invention has been provided.

DESCRIPTION OF THE PREFERRED EMBODIMENTS

For a better understanding of the invention, reference should initially be made to FIGS. 1 to 3, illustrating a known driving circuit.

FIG. 1 illustrates the cross section of a semiconductor wafer in which a circuit for driving inductive loads, with P-type substrate, is provided. In detail, 1 indicates the P-type substrate, and 2–5 indicate different epitaxial wells of $N^-$-type conductivity, mutually separated and isolated by means of the P-type isolation regions 6. According to the prior art, the P substrate is clamped to the earth and forms with the epitaxial wells 2–5 P-N rectifying junctions which must be inversely biased to keep the various epitaxial wells isolated from one another. Said wells then accommodate the various layers and the various regions of semiconductor material with alternate conductivity type so as to obtain a complete driving integrated circuit, such as for example illustrated in FIG. 2 and generally indicated at 10.

With reference thus to FIG. 2, the driving integrated circuit 10 essentially comprises a stage 11 which can be configured differently, according to the required functions, to drive a power element 13 in turn intended to drive an external load. The integrated circuit 10 furthermore comprises a power supply, here represented by a voltage source 12, a terminal whereof (connected to a circuit pad 15, constituting the reference output of the circuit) represents the ground of the circuit, and the other terminal whereof is connected to the different components of the driving stage 11 to supply them. In turn, the power transistor 13 is connected with its collector to a supply voltage $V_{cc}$ and with its emitter to a contact pad 14 constituting the output terminal of the driving circuit. Said output terminal is connected to a terminal of the inductive load 16, the other terminal whereof is connected to the earth 17.

Accordingly, when the transistor 13 is controlled by the driving stage 11 so as to supply a positive current to the load 16, the latter remains at positive voltage, while when the transistor 13 is switched off, a negative overvoltage forms across the inductor 16, as illustrated in FIG. 3. During this phase, one of the epitaxial wells constituting the device may reach a voltage which is lower than that of the substrate, which condition, as mentioned, is to be avoided.

To solve this problem the invention teaches to bias the substrate at the output potential when the latter becomes negative, for example in the manner illustrated in FIG. 4.

Reference should thus be made to FIG. 4, wherein the general circuit diagram of the integrated circuit according to the invention is illustrated, in which the parts in common with the known embodiment illustrated in FIG. 2 have been given the same reference numerals.

According to the invention, the driving integrated circuit 20 again comprises a driving stage 11, a power supply 12, a power transistor 13 as well as output 14 and reference 15 terminals for connection to two different terminals of the inductive load 16 referred to the earth 17. Differently from the known embodiment, according to the invention the substrate, indicated at 30, is not clamped to the ground and then to the external earth of the system, but three diodes 21, 22 and 23 are provided to electrically separate or connect the substrate from or to the output and from or to the earth of the system, according to the operating state. In detail, the circuit 20 has a first diode 21 connected with its anode to the substrate 20 and with its cathode to the output terminal 14, a second diode 22 connected with its anode to the substrate 30 and with its cathode to the reference terminal 15 and a third diode 23 connected with its anode to the internal ground 24 of the system and with its cathode to the reference terminal 15.

Accordingly, during the conduction of the power transistor 13, when a positive voltage is present on the load, the diode 21 is inversely biased, while the diodes 22 and 23 are forward biased. Therefore the current of the substrate flows through the diode 22 towards the earth. In this case (the drop on the diodes 22 and 23 being approximately equal) the potential of the ground 24 is equal to the potential of the substrate and all the epitaxial wells are mutually isolated. When, upon control of the driving stage 11, the power transistor is switched off and the output voltage becomes negative, the diode 21 is forward biased (thus connecting the substrate to the output terminal) while the diode 22 is inversely biased, separating the substrate from the earth 17. Then the substrate current flows through the diode 21, biasing the substrate 30 at a voltage equal to the (negative) output voltage minus the drop on the diode 21.

An embodiment of the circuit of FIG. 4 is illustrated in FIG. 5, showing the substrate 30 with P-type polarity and the different epitaxial wells 31-35 with N⁻-type conductivity mutually separated by the P-type isolation regions 36. In detail, the epitaxial wells 31 and 35 are provided for the accommodation of the different layers which form the components of the driving stage 11, while the epitaxial wells 32, 33 and 34 are intended for accommodating the diodes 21, 22 and 23. In particular, the epitaxial well 32 accommodates the P-type base region 37 (defining a circuit ground region) inside which the N+-type emitter region 38 is arranged, forming with the previous one the diode 23. The base region 37 is connected to the ground of the system, here indicated by the terminal 24, while the region 38 is electrically connected through line 42 to the reference terminal 15 of the circuit. The epitaxial well 33, forming with the substrate 30 the diode 22, comprises in its interior the N+-type region 39 for connection to the output terminal 15 in turn connected to the external earth potential of the circuit. Finally the epitaxial well 34, forming with the substrate 30 the diode 21, comprises in its interior the N+-type region 40 connected to the output terminal 14 at the voltage $V_{out}$.

In practice therefore, as explained above, when the output voltage $V_{OUT}$ is greater than the external reference potential (earth 17) the junction between the well 34 and the substrate 30 (diode 21) is reverse biased, while the epitaxial well 33/substrate 30 junction (diode 22) is forward biased and allows the discharge of the curent of the substrate towards the terminal 15. In this situation, the substrate has a lower potential than all the epitaxial wells referred to the ground 24, so that an effective separation and isolation thereof is achieved. Instead, when the output voltage goes to a value lower than the ground, the epitaxial well 34/substrate 30 junction is forward biased, linking the substrate 30 to said output voltage (apart from the drop on the diode 21 formed by said junction). Accordingly the current in the substrate can be reliably discharged through the output terminal, without affecting the other epitaxial wells of the driving stage.

As is apparent from the preceding description, the invention fully achieves the intended aim and objects. In fact, a driving integrated circuit has been provided which operates reliably regardless of the output voltage of the circuit. Furthermore, the presented solution is simple, cheap, and producible by means of current methods, without requiring a substantial increase in the occupied area.

The invention thus conceived is susceptible to numerous modifications and variations, all of which are within the scope of the inventive concept. Furthermore, all the details may be replaced with other technically equivalent elements.

We claim:

1. An integrated circuit for driving inductive loads, comprising a semiconductor body including at least one substrate and a plurality of isolated epitaxial regions in said substrate, at least one of said isolated epitaxial region having a portion thereof defining a circuit ground region, said integrated circuit having at least one output terminal for connection to an inductive load and a reference terminal for connection to a reference potential, said output terminal having a variable output potential, said circuit comprising first switching means interposed between said substrate and said output terminal, second switching means interposed between said substrate and said reference terminal and third switching means interposed between said reference terminal and said circuit ground region for connecting said substrate to said reference terminal and keeping said circuit ground region at a same potential as said substrate when said output potential is greater than said reference potential and for connecting said substrate to said output terminal when said output potential becomes smaller than said reference potential.

2. An integrated circuit according to claim 1, wherein said first, second and third switching means comprise diodes.

3. An integrated circuit for driving inductive loads having at least one output terminal for connection to an inductive load and a reference terminal for connection to a reference potential, said output terminal having a variable output potential, said integrated circuit comprising:

a semiconductor body including at least one substrate of one conductivity type;

a plurality of isolated epitaxial regions having a conductivity type opposite to said one conductivity type and arranged adjacent to said substrate, one of said isolated epitaxial region comprising a first zone of said opposite conductivity type arranged adjacent to said substrate and forming therewith a first rectifying juction, a connection between said output terminal and said first zone;

a second of said isolated epitaxial regions comprising a second zone of said opposite conductivity type and arranged adjacent to said substrate and forming therewith a second rectifying junction;

a connection between said reference terminal and said second zone;

a third of said isolated epitaxial regions accommodating a third zone of said one conductivity type defining a circuit ground region;

a fourth zone of said opposite conductivity type arranged within said third zone and forming therewith a third rectifying junction;

a connection between said reference terminal and thus said second zone and said fourth zone;

said second rectifying junction connecting said substrate to said reference terminal when said output potential is greater than said reference potential;

said first rectifying junction connecting said substrate to said output terminal when said output potential becomes smaller than said reference potential; and said third rectifying junction keeping said circuit ground region at a same potential as said substrate when said output potential is greater than said reference potential.

4. An integrated circuit according to claim 3, wherein said one conductivity type is P-type and said opposite conductivity type is N-type.

5. An integrated circuit according to claim 3, wherein said first zone is lightly doped with conductivity determining impurities.

* * * * *